United States Patent [19]
Dittus et al.

[11] Patent Number: 6,108,203
[45] Date of Patent: Aug. 22, 2000

[54] COOLING SYSTEM FOR A COMPUTER SYSTEM HAVING DUAL FANS AND A MOVABLE BAFFLE

[75] Inventors: Karl Klaus Dittus, Raleigh; Mohanlal S. Mansuria; Martin Joseph Crippen, both of Apex; Jason Aaron Matteson, Raleigh; Leo H. Webster, Jr., Cary, all of N.C.

[73] Assignee: International Business Machines Corporation, Armonk, N.Y.

[21] Appl. No.: 09/267,419

[22] Filed: Mar. 12, 1999

[51] Int. Cl.[7] ....................................................... H05K 7/20
[52] U.S. Cl. .......................... 361/695; 165/80.3; 165/122; 236/49.5; 454/184; 454/353
[58] Field of Search .......................... 62/259.2; 165/80.3, 165/122–126; 236/49.1, 49.3, 49.5; 361/687–688, 690, 694–695; 454/184, 353

[56] References Cited

U.S. PATENT DOCUMENTS

| | | | |
|---|---|---|---|
| 4,495,545 | 1/1985 | Dufresne et al. | 361/695 |
| 4,648,007 | 3/1987 | Garner | 361/695 |
| 5,793,610 | 8/1998 | Schmitt et al. | 361/695 |
| 6,005,770 | 12/1999 | Schmitt | 361/695 |
| 6,011,689 | 1/1920 | Wrycraft | 361/695 |

*Primary Examiner*—Gregory Thompson
*Attorney, Agent, or Firm*—Martin J. McKinley

[57] ABSTRACT

A computer system includes a housing that is divided into three compartments; two fan compartments, each containing a fan, and a third compartment containing heat generating electronic components. The air discharged from the fans flows through outlets in the fan compartments and into the third compartment to cool the electronic components. A single baffle is rotatably coupled between the two fan compartments using a vertically oriented hinge. When one of the fans fails, the air pressure from the working fan rotates the baffle until it covers the outlet of the fan compartment containing the failed fan. This enhances the flow of air from the working fan into the third compartment, and restricts the reverse flow of air through the dead fan compartment. When both fans are functioning, air pressure from both fans moves the baffle to a "midway" or "neutral" position, such that the air from both fans flows into the third compartment.

3 Claims, 4 Drawing Sheets

COOLING SYSTEM FOR A COMPUTER SYSTEM HAVING DUAL FANS AND A MOVABLE BAFFLE

BACKGROUND OF THE INVENTION

This invention pertains to computer systems and other information handling systems and, more particularly, to a computer system employing at least two fans in its cooling system and a movable baffle that, in the event of a failure of one of the fans, restricts the loss of air flow from the working fan out through the compartment housing the failed fan.

In many computer systems that use forced air cooling, multiple air moving devices are frequently used so that if one air moving device fails, the other can provide cooling for the system. If the computer system has a low air flow impedance and one of the air moving devices fails, then any leakage of air back through the failed air moving device is usually insignificant. In a computer system having a high air flow impedance, however, the failure of an air moving device usually causes the air flow from the working air moving device to leak out of the system through the failed device. This reduces the air flow through the system, thereby reducing the cooling of integrated circuits and other heat generating devices. This problem can be particularly acute when the air moving devices are arranged in parallel.

As microprocessors become more complex, they consume more electrical power and generate more heat, which must be removed. High density heat sinks are frequently used to cool processor modules, but these heat sinks offer a significant impedance to air flow. For example, an air flow of more than 20 CFM at 600 FPM is required to cool about 130 Watts of power generated by a processor module in a current, state-of-the-art, four processor computer system, and an air flow of 20 CFM though the heat sink can offer an impedance of more than 0.2 inch of water.

To achieve cooling redundancy in such a system, multiple air moving devices, such as blowers or fans, are typically installed in parallel and fully ducted through the processor modules first so as to provide sufficient quantities of air to cool the system when one of the air moving device fails. The high impedance of the processor module heat sinks causes the plenum in the computer system to become pressurized when the air moving devices are operating. When one of the air moving devices fails, the high air flow resistance (air pressure drop) through the processor module heat sinks will cause a significant amount of air from the functioning air moving device to leak out through the failed device, rather than cooling the processor modules. This reduction in air flow over the processor module heat sinks can significantly impact system cooling.

The prior art solution to this problem is to use gravity operated baffles, one over each outlet of the compartments that house the fans. Besides requiring one baffle per fan compartment, a disadvantage of this prior art solution is that the working fans must overcome the weight of the baffle in order to open up the air flow path, thereby adding impedance and decreasing cooling efficiency.

To overcome the problem of air leakage through a failed air moving device and the disadvantages of the prior art solution, the invention described below includes a movable baffle between two air moving devices that automatically and significantly increases the reverse air flow impedance through a failed air moving device, but without significantly increasing the forward air flow impedance through a functioning air moving device.

SUMMARY OF THE INVENTION

Briefly, the invention is a computer system that includes a housing having first, second and third compartments. Each of the first and second compartments has an inlet opening for admitting air and an outlet opening through with air discharged from the first and second compartments flows into the third compartment. The third compartment includes heat generating electronic components. First and second air moving devices are respectively located in the first and second compartments. Each of the first and second air moving devices has an inlet and an outlet. The first compartment has an inlet opening for admitting air to the inlet of the first air moving device. Similarly, the second compartment has an inlet opening for admitting air to the inlet of the second air moving device. A baffle is movably attached to the housing between the first and second compartments. The baffle is positioned over the outlet opening of the first compartment when the first air moving device fails to restrict the leakage of air from the second air moving device through the first compartment so that air flows from the second compartment into the third compartment. The baffle is positioned over the outlet opening of the second compartment when the second air moving device fails to restrict the leakage of air from the first air moving device through the second compartment so that air flows from the first compartment into the third compartment. The baffle is biased in a neutral position between the outlet openings of the first and second compartments when both the first and second air moving devices are working so that air flows from both the first and second compartments into the third compartment.

DESCRIPTION OF THE ILLUSTRATIVE EMBODIMENT

Figure 1:
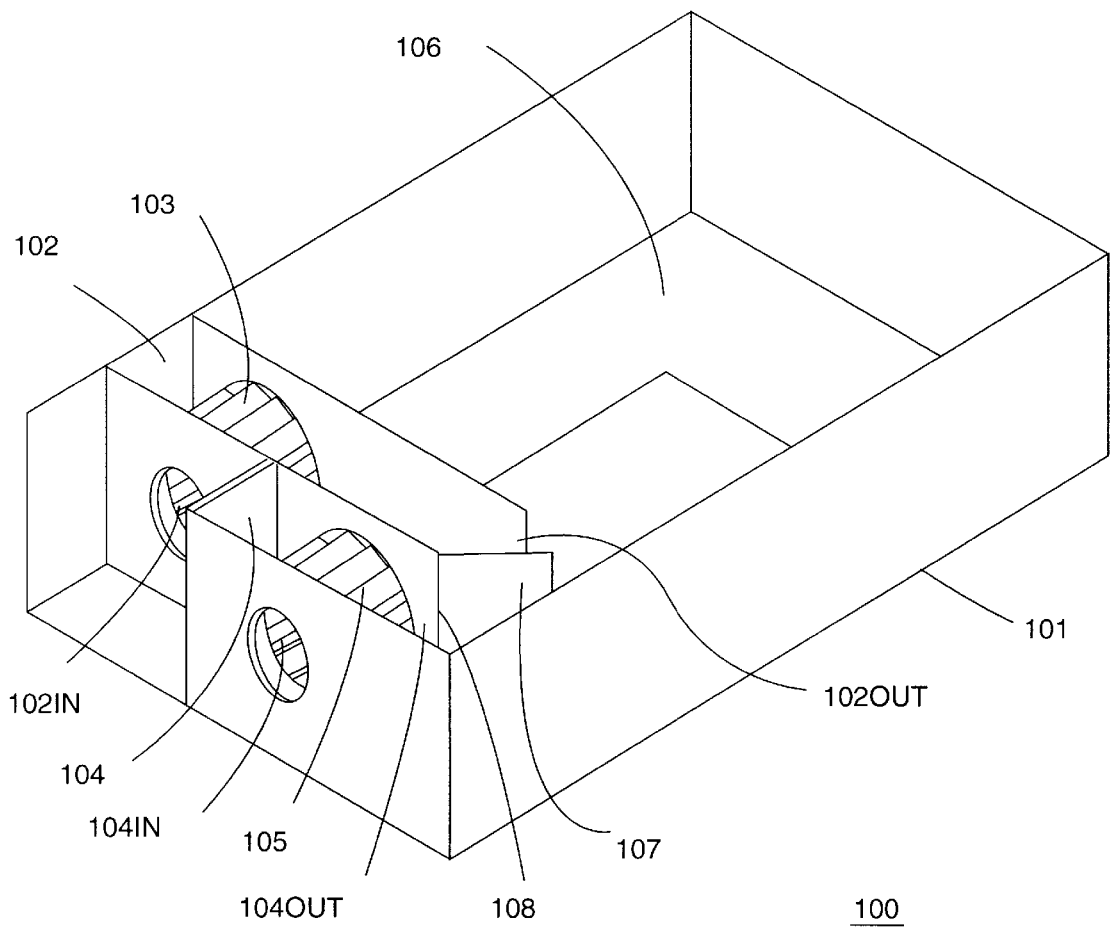
FIG. 1 is a perspective view of a computer housing of the present invention in which the top surface has been removed to reveal the cooling system of the present invention.

FIG. 1 is a perspective view of an illustrative embodiment of a computer housing of the present invention. Referring to this figure, computer system 100, which may be any information handling system, includes a housing 101. Housing 101 is divided into at least three compartments 102, 104 and 106. Compartment 102 includes an air moving device, such as fan 103, and an inlet opening $102_{IN}$ connected to the intake of fan 103. Similarly, Compartment 104 includes an air moving device, such as fan 105, and an inlet opening $104_{IN}$ connected to the intake of fan 105. Compartment 106 houses heat generating electronic components (not illustrated) of computer system 100. During the normal operation of both fans, the discharge of air from fans 103 and 105 flows, respectively, through outlet openings $102_{OUT}$ and $104_{OUT}$ of compartments 102 and 104, and into compartment 106 where the air is used to cool the electronic components of computer system 100.

A movable air baffle 107 is coupled to housing 101 through hinge 108. When fans 103 and 105 are off, baffle 107 is free to rotate around hinge 108 and, since the hinge is vertically oriented, the gravitational forces on the baffle will not move the baffle into one position or another. In other words, in the absence of air flow from fans 103 and 105, the baffle is "neutrally biased" such that no net rotational forces are exerted on the baffle in any position. When baffle 107 is rotated to one of the two extreme positions, the baffle covers outlet $102_{OUT}$ of compartment 102. When baffle 107 is rotated to the other extreme position, it covers outlet $104_{OUT}$ of compartment 104. While the vertically oriented hinge 108 is preferred, other devices may be suitable for achieving neutral or near neutral bias.

Figure 2:
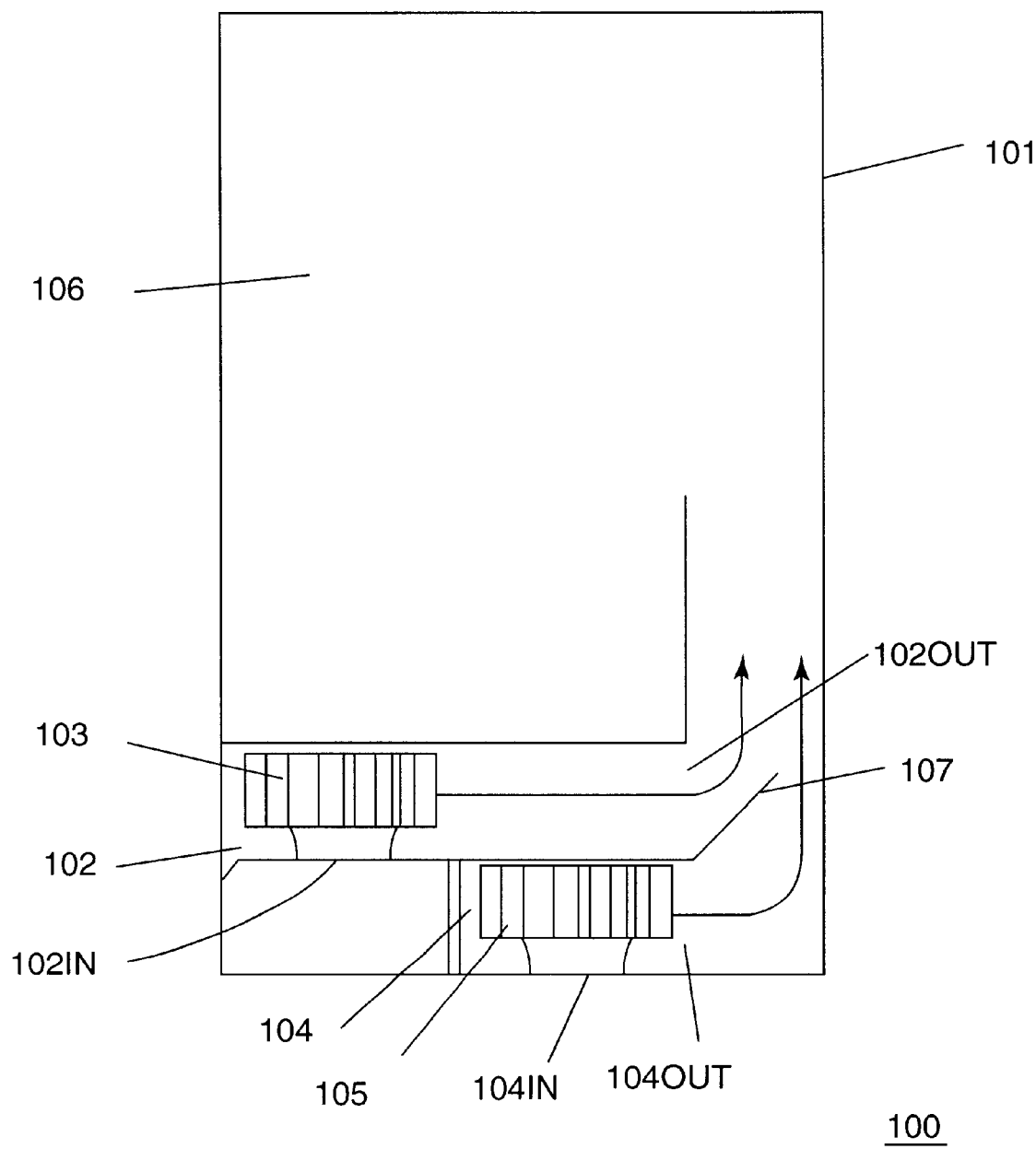
FIG. 2 is a plan view of the computer system of the present invention in which both fans are operational, such that the movable baffle is neutrally positioned substantially midway between the outlets of the two fan compartments.

FIG. 2 is a plan view of computer system 100 in which both fans 103 and 105 are operational. Referring to this figure, note that the air discharged from fans 103 and 105 causes baffle 107 to be positioned at approximately a 45° angle, such that the air flow from both fans is substantially equal (presuming that both fans are of equal capacity). This midway position of baffle 107 results from the force of the air discharged from fan 103 on one side of the baffle being equal to the force of the air discharged from fan 105 on the other side of the baffle. In this midway position, there is little impediment to the flow of air from either fan into compartment 106.

Figure 3:
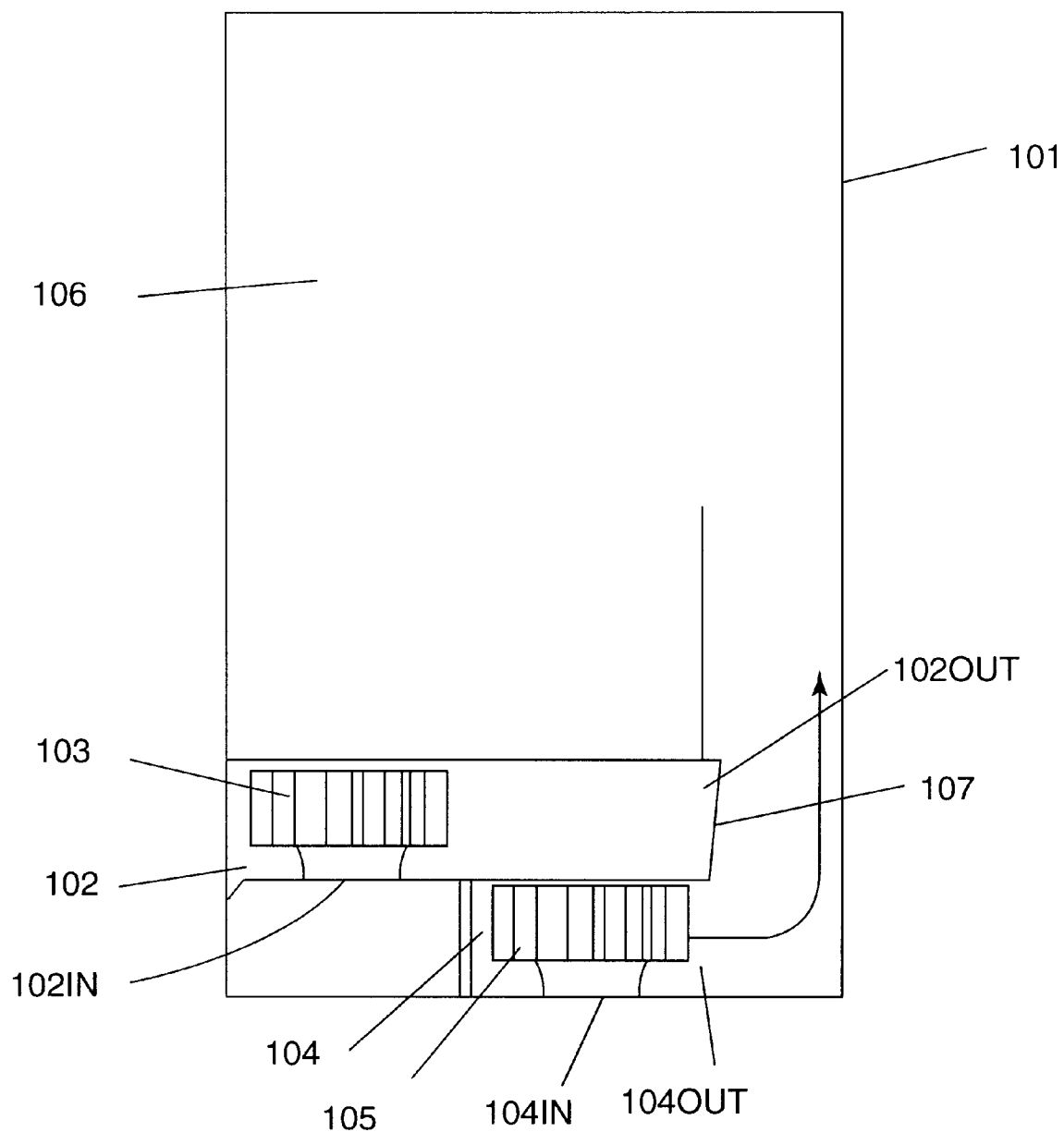
FIG. 3 is a plan view of the computer system of the present invention in which the first fan has failed and the second fan is operational, such that the movable baffle closes off the outlet of the first fan compartment.

FIG. 3 is a plan view of computer system 100 wherein fan 103 has failed and fan 105 is operational. Referring to this figure, the air pressure from fan 103 that was holding baffle 107 in the midway position drops to zero (ambient) after fan 103 fails. But the pressure on the other side of baffle 107, which results from working fan 105, is greater than zero so the baffle rotates until it covers outlet $102_{OUT}$. Since the pressure inside the system is higher than the ambient pressure outside the system, baffle 107 is held closed against outlet $102_{OUT}$. With baffle 107 covering outlet $102_{OUT}$, "reverse air flow" or "leakage" from working fan 105 back out through compartment 102 is severely restricted (ideally, reduced to zero), thereby directing almost the entire flow of air from working fan 105 into compartment 106 where it is used to cool the system components.

Figure 4:
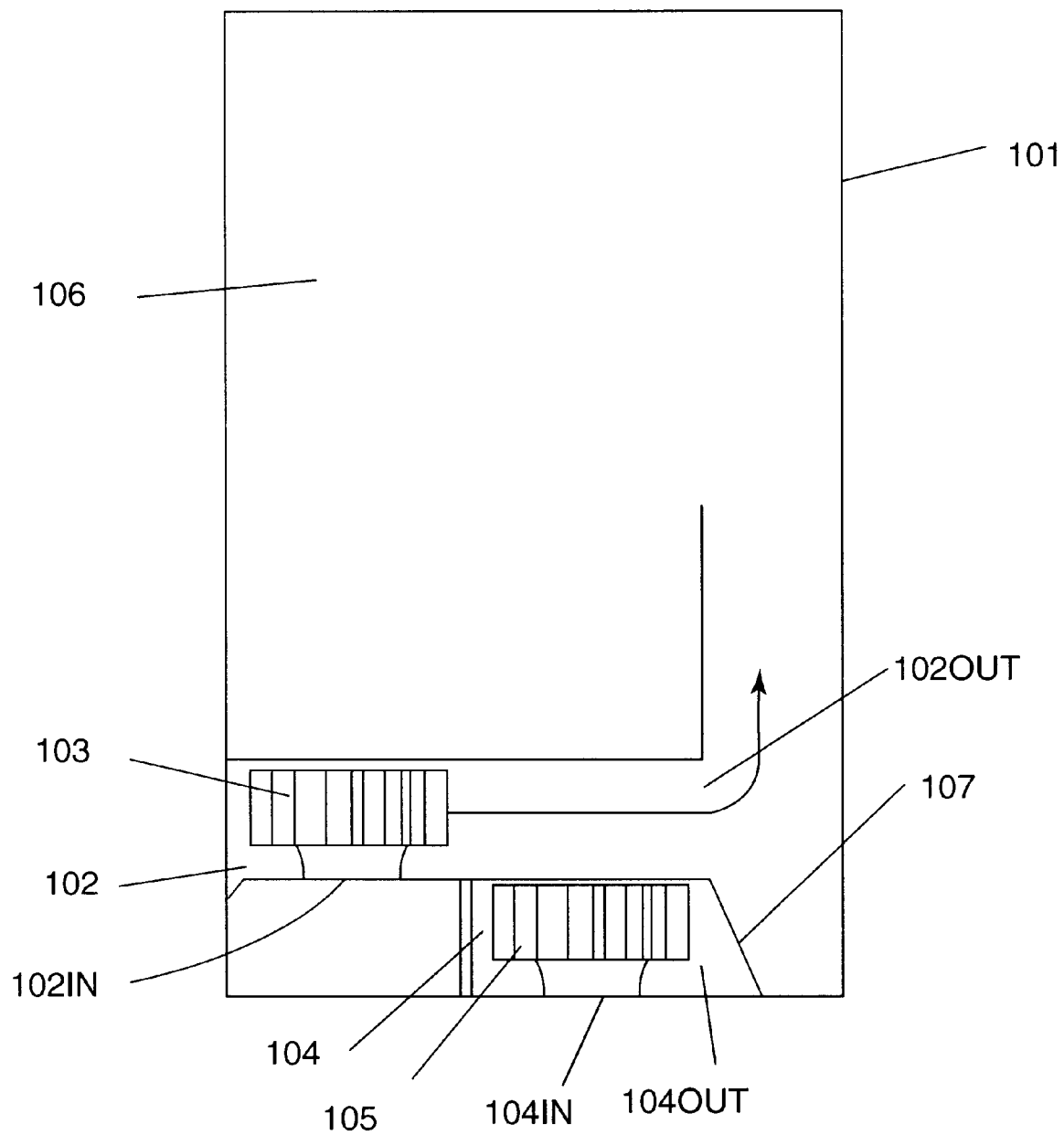
FIG. 4 is a plan view of the computer system of the present invention in which the second fan has failed and the first fan is operational, such that the movable baffle closes off the outlet of the second fan compartment.

FIG. 4 is a plan view of computer system 100 wherein fan 105 has failed and fan 103 is operational. Referring to this figure, the air pressure from fan 105 that was holding baffle 107 in the midway position (when both fans were working) drops to zero after fan 105 fails. But the pressure on the other side of baffle 107, which results from working fan 103, is greater than zero so the baffle rotates until it covers outlet $104_{OUT}$. Since the pressure inside the system is higher than the ambient pressure outside the system, baffle 107 is held closed against outlet $104_{OUT}$. With baffle 107 covering outlet $104_{OUT}$, air leakage from working fan 103 back out through compartment 104 is severely restricted, thereby directing almost the entire flow of air from working fan 103 into compartment 106 where it is used to cool the system components.

Since little or no air can escape through the compartment containing the failed fan, the failed fan can be easily replaced without the need to shut the system down and without effecting the cooling of the system during fan replacement. After the failed fan is replaced and switched on, the pressure from the new fan will, momentarily, be higher than the pressure from the other fan. This increased pressure from the new fan causes baffle 107 to rotate, thereby uncovering the outlet of the compartment containing the new fan, and dropping the pressure on the discharge side of the new fan. Baffle 107 continues to rotate until the pressure on both sides of baffle 107 is equal. When the baffle pressure is equal on both sides, baffle 107 will be positioned substantially "midway", as illustrated in FIG. 2, and air flows from both fans into compartment 106.

We claim as our invention:

1. A computer system, comprising:

a housing having first, second and third compartments, each of said first and second compartments having an outlet opening through which air discharged from said first and second compartments flows into said third compartment, said third compartment including heat generating electronic components;

first and second air moving devices respectively located in said first and second compartments, each of said first and second air moving devices having an inlet and an outlet, said first compartment having an inlet opening for admitting air into the inlet of said first air moving device, and said second compartment having an inlet opening for admitting air into the inlet of said second air moving device; and a baffle movably attached to said housing between said first and second compartments, said baffle being positioned over the outlet opening of said first compartment when said first air moving device fails to restrict the leakage of air from said second air moving device through said first compartment such that air flows from said second compartment into said third compartment, said baffle being positioned over the outlet opening of said second compartment when said second air moving device fails to restrict the leakage of air from said first air moving device through said second compartment such that air flows from said first compartment into said third compartment, said baffle being positioned in a neutral position between the outlet openings of said first and second compartments when both said first and second air moving devices are working such that air flows from both said first and second compartments into said third compartment.

2. The computer system of claim 1, wherein said baffle is rotatably attached to said housing.

3. The computer system of claim 1, wherein said baffle is rotatably attached to said housing along a vertical axis, such that the weight of said baffle does not act to close the baffle against the outlet openings of said first and second compartments.

* * * * *